(12) United States Patent
Kim

(10) Patent No.: US 9,966,121 B2
(45) Date of Patent: May 8, 2018

(54) COMPARISON CIRCUITS AND SEMICONDUCTOR DEVICES EMPLOYING THE SAME

(71) Applicant: SK hynix Inc., Icheon-si, Gyeonggi-do (KR)

(72) Inventor: Chang Hyun Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/677,226

(22) Filed: Aug. 15, 2017

(65) Prior Publication Data

US 2017/0358337 A1     Dec. 14, 2017

Related U.S. Application Data

(63) Continuation of application No. 15/376,132, filed on Dec. 12, 2016, now abandoned.

(30) Foreign Application Priority Data

Jun. 14, 2016   (KR) .................. 10-2016-0073702

(51) Int. Cl.
| G11C 16/26 | (2006.01) |
| G11C 7/22 | (2006.01) |
| G06F 11/10 | (2006.01) |
| G11C 7/12 | (2006.01) |
| H03K 5/24 | (2006.01) |
| H03K 19/21 | (2006.01) |

(52) U.S. Cl.
CPC ............ *G11C 7/22* (2013.01); *G06F 11/1044* (2013.01); *G11C 7/12* (2013.01); *G11C 16/26* (2013.01); *H03K 5/2472* (2013.01); *H03K 19/21* (2013.01)

(58) Field of Classification Search
CPC .............................. G11C 11/005; G11C 16/26
USPC ............................................ 365/185.2, 189.2
See application file for complete search history.

(56) References Cited

U.S. PATENT DOCUMENTS

| 3,845,361 | A | * | 10/1974 | Watase | ............... | G07C 9/00103 |
| | | | | | | 340/5.66 |
| 5,278,456 | A | * | 1/1994 | Bechade | ................... | G06F 1/08 |
| | | | | | | 327/175 |
| 6,799,243 | B1 | * | 9/2004 | Pereira | ................... | G11C 15/00 |
| | | | | | | 365/203 |
| 2002/0065860 | A1 | | 5/2002 | Grisenthwaite et al. | | |
| 2002/0083108 | A1 | | 6/2002 | Tierno | | |
| 2002/0089354 | A1 | | 7/2002 | Sanwo et al. | | |
| 2003/0058001 | A1 | | 3/2003 | Boerstler et al. | | |
| 2004/0068500 | A1 | * | 4/2004 | Rizzo | ...................... | G06F 7/026 |
| 2004/0117723 | A1 | | 6/2004 | Foss | | |

(Continued)

FOREIGN PATENT DOCUMENTS

KR     1020140018095 A     2/2014

*Primary Examiner* — Michael Tran
(74) *Attorney, Agent, or Firm* — William Park & Associates Ltd.

(57) ABSTRACT

A comparison circuit may be provided. The comparison circuit may include a number of first logic circuits and a number of second logic circuits. The first logic circuits and second logic circuits may be configured to compare logic levels of a plurality of input signals with each other to generate a comparison signal having a first logic level if the number of input signals have an even number of input signals at a second logic level.

20 Claims, 7 Drawing Sheets

(56) References Cited

U.S. PATENT DOCUMENTS

| | | | |
|---|---|---|---|
| 2004/0239802 A1* | 12/2004 | Kim | H04N 7/012 348/448 |
| 2004/0252549 A1* | 12/2004 | Kim | G11C 29/1201 365/154 |
| 2005/0027777 A1 | 2/2005 | Rhee et al. | |
| 2005/0035783 A1 | 2/2005 | Wang | |
| 2006/0028900 A1 | 2/2006 | Shin et al. | |
| 2008/0022170 A1 | 1/2008 | Byun et al. | |
| 2008/0259695 A1 | 10/2008 | Cho | |
| 2008/0285698 A1* | 11/2008 | Mallinson | G06F 1/025 375/376 |
| 2009/0015292 A1 | 1/2009 | Nishitani et al. | |
| 2009/0052218 A1 | 2/2009 | Kang | |
| 2009/0096495 A1* | 4/2009 | Keigo | G01K 7/01 327/142 |
| 2009/0128382 A1* | 5/2009 | Matsukawa | G01R 31/3167 341/120 |
| 2009/0224806 A1* | 9/2009 | Huang | H04L 7/0062 327/72 |
| 2009/0243652 A1* | 10/2009 | Dorairaj | G11C 7/1006 326/38 |
| 2009/0303093 A1* | 12/2009 | Gribok | H03M 1/002 341/141 |
| 2010/0329069 A1 | 12/2010 | Ito et al. | |
| 2011/0304357 A1* | 12/2011 | Tokairin | H03K 5/26 327/12 |
| 2011/0316823 A1* | 12/2011 | Otani | G09G 3/3688 345/204 |
| 2012/0206281 A1* | 8/2012 | Bashirullah | H03M 1/1061 341/110 |
| 2013/0082735 A1 | 4/2013 | Nakamura et al. | |
| 2013/0082736 A1 | 4/2013 | Dono | |
| 2013/0201746 A1 | 8/2013 | Chung | |
| 2013/0282973 A1* | 10/2013 | Kim | G11C 11/40622 711/106 |
| 2014/0226707 A1* | 8/2014 | Kaviani | H04L 25/03063 375/233 |
| 2014/0320464 A1* | 10/2014 | Ryu | G09G 3/3688 345/204 |
| 2015/0200668 A1 | 7/2015 | Uesugi et al. | |
| 2015/0226825 A1* | 8/2015 | Kaiwa | H04L 25/0278 324/601 |
| 2016/0028302 A1* | 1/2016 | Low | H02M 3/073 363/50 |
| 2016/0065214 A1* | 3/2016 | Takeda | H03K 19/0013 326/121 |
| 2016/0112042 A1* | 4/2016 | Hanson | G06F 1/06 327/543 |
| 2016/0133314 A1* | 5/2016 | Hwang | G11C 11/40611 365/189.02 |
| 2016/0214377 A1* | 7/2016 | Shima | B41J 2/04541 |
| 2016/0227135 A1* | 8/2016 | Matolin | H04N 3/155 |
| 2016/0241421 A1* | 8/2016 | Lim | H04L 25/0272 |

* cited by examiner

FIG. 5

| | IN<1> | IN<2> | IN<3> | IN<4> | IN<5> | IN<6> | IN<7> | IN<8> | COMP |
|---|---|---|---|---|---|---|---|---|---|
| FIRST CASE | H | L | H | L | H | L | H | L | L |
| SECOND CASE | H | H | H | H | L | L | L | L | L |
| THIRD CASE | H | H | H | L | L | L | L | L | H |
| FOURTH CASE | H | H | L | L | H | H | L | H | H |

COMPARISON CIRCUITS AND SEMICONDUCTOR DEVICES EMPLOYING THE SAME

CROSS-REFERENCE TO RELATED APPLICATIONS

The present application is a continuation application of U.S. application Ser. No. 15/376,132, filed on Dec. 2, 2016, and claims priority under 35 U.S.C 119(a) to Korean Patent Application No. 10-2016-0073702, filed on Jun. 14, 2016, which is incorporated herein by reference in its entirety.

BACKGROUND

1. Technical Field

Embodiments of the present disclosure may generally relate to comparison circuits configured to compare logic levels of a plurality of data with each other and semiconductor devices employing the same.

2. Related Art

Semiconductor devices may be designed and fabricated to include a test mode function for evaluating the operation thereof. That is, various parameters of the semiconductor devices may be measured in a test mode at a wafer level or at a package level. The tested semiconductor devices may be sorted into good chips or failed chips according to the test results.

Each of the semiconductor devices may execute a write operation and a read operation to receive and output a plurality of data through pads, and each semiconductor device may be evaluated by comparing and sensing logic levels of the data outputted from the pads.

As the semiconductor devices become more highly integrated with the development of fabrication process techniques, the numbers of failed memory cells in the tested semiconductor devices have been increasing. Increase of the number of failed memory cells in the tested semiconductor devices may lead to not only a reduction in production yield of the semiconductor devices but also difficulty in guaranteeing a large memory capacity for the semiconductor devices. Accordingly, error correction code (ECC) circuits and compressive parallel test circuits have been widely employed in the semiconductor devices to solve data errors which are due to the failed memory cells.

SUMMARY

According to an embodiment, a semiconductor device may be provided. According to an embodiment, a comparison circuit may be provided. The comparison circuit may include a number of first logic circuits and a number of second logic circuits. The first logic circuits and second logic circuits may be configured to compare logic levels of a plurality of input signals with each other to generate a comparison signal having a first logic level if the number of input signals have an even number of input signals at a second logic level.

According to an embodiment, a comparison circuit may include a number of first logic circuits and a number of second logic circuits, the first logic circuits and second logic circuits configured to compare logic levels of a plurality of input signals with each other to generate a comparison signal having a first logic level if the number of input signals have an even number of input signals at a second logic level.

According to an embodiment, wherein the second logic circuits and first logic circuits are configured to compare the logic levels of the plurality of input signals with each other to generate the comparison signal having the second logic level if the number of input signals have an odd number of input signals at the second logic level.

According to an embodiment, wherein the number of first logic circuits is at least seven.

According to an embodiment, wherein the number of second logic circuits is at least three.

According to an embodiment, wherein the plurality of input signals includes first to eighth input signals.

According to an embodiment, wherein each of the first logic circuits execute an exclusive OR operation, and wherein each of the second logic circuits execute an exclusive NOR operation.

According to an embodiment, wherein each of the first logic circuits execute a three-input type exclusive OR operation, and wherein each of the second logic circuits execute a three-input type exclusive NOR operation.

According to an embodiment, wherein a first logic circuit, from the number of first logic circuits, is configured to output a second input signal to a first output node if a first input signal has the second logic level and configured to drive the first output node to generate a first internal signal based on the second input signal if the first input signal has the first logic level, and wherein a second logic circuit, from the number of second logic circuits, is configured to output the second input signal to a second output node if the first input signal has the first logic level and configured to drive the second output node to generate a second internal signal based on the second input signal if the first input signal has the second logic level.

According to an embodiment, wherein the first logic circuits and second logic circuits are arranged in a tree structure.

According to an embodiment, a comparison circuit may include a number of first logic circuits and a number of second logic circuits, the first logic circuits and second logic circuits arranged in a tree structure and configured to compare logic levels of a plurality of input signals with each other to generate a comparison signal, having a first logic level, dependent on whether the number of input signals provided is an even number or odd number of input signals at a second logic level.

BRIEF DESCRIPTION OF THE DRAWINGS

FIG. 5 is a table illustrating a representation of an example of an operation of a comparison circuit according to an embodiment of the present disclosure.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
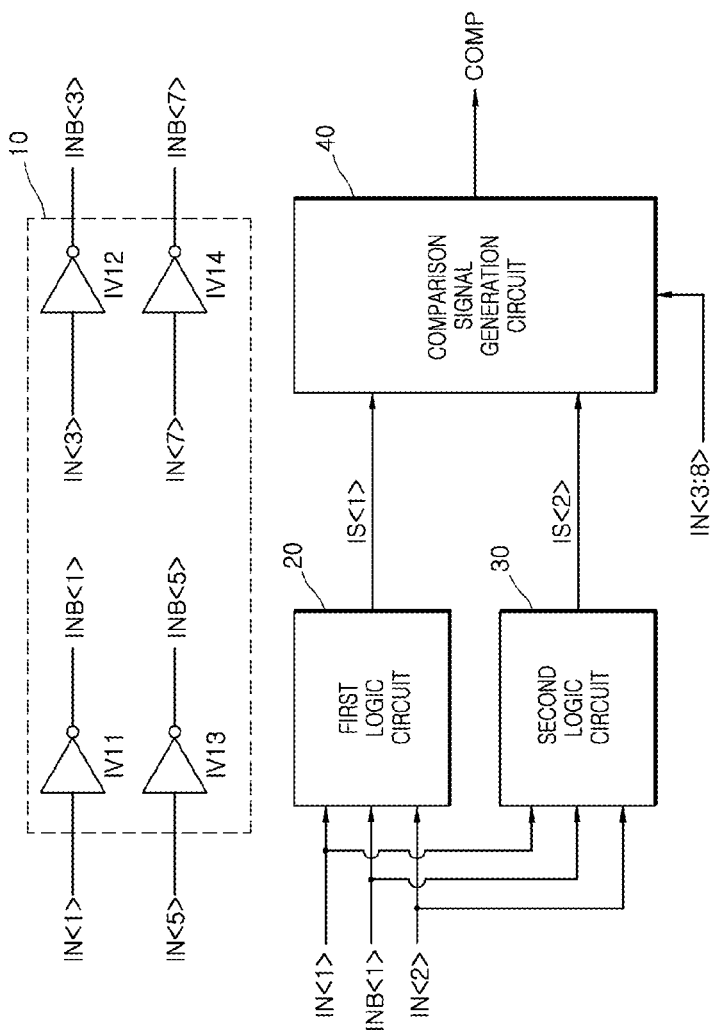
FIG. 1 is a block diagram illustrating a representation of an example of a configuration of a comparison circuit according to an embodiment of the present disclosure.

Referring to FIG. 1, a comparison circuit according to an embodiment may include an inverting circuit 10, a first logic circuit 20, a second logic circuit 30 and a comparison signal generation circuit 40.

The inverting circuit 10 may include a first buffer IV11, a second buffer IV12, a third buffer IV13 and a fourth buffer IV14.

The first buffer IV11 may be realized using an inverter and may inversely buffer a first input signal IN<1> to generate a first inverted input signal INB<1>.

The second buffer IV12 may be realized using an inverter and may inversely buffer a third input signal IN<3> to generate a third inverted input signal INB<3>.

The third buffer IV13 may be realized using an inverter and may inversely buffer a fifth input signal IN<5> to generate a fifth inverted input signal INB<5>.

The fourth buffer IV14 may be realized using an inverter and may inversely buffer a seventh input signal IN<7> to generate a seventh inverted input signal INB<7>.

The first logic circuit 20 may execute an exclusive OR operation of the first input signal IN<1> and a second input signal IN<2> to generate a first internal signal IS<1>. The first logic circuit 20 may output the second input signal IN<2> to a first output node (nd21 of FIG. 2) if the first input signal IN<1> has a first logic level (e.g., a logic "high" level) and may drive the first output node (nd21 of FIG. 2) to generate the first internal signal IS<1> in response to the second input signal IN<2> if the first input signal IN<1> has a second logic level (e.g., a logic "low" level). An operation of the first logic circuit 20 generating the first internal signal IS<1> according to logic levels of the first and second input signals IN<1> and IN<2> will be described later.

The second logic circuit 30 may execute an exclusive NOR operation of the first and second input signals IN<1> and IN<2> to generate a second internal signal IS<2>. The second logic circuit 30 may output the second input signal IN<2> to a second output node (nd31 of FIG. 3) if the first input signal IN<1> has the second logic level (e.g., a logic "low" level) and may drive the second output node (nd31 of FIG. 3) to generate the second internal signal IS<2> in response to the second input signal IN<2> if the first input signal IN<1> has the first logic level (e.g., a logic "high" level). An operation of the second logic circuit 30 generating the second internal signal IS<2> according to logic levels of the first and second input signals IN<1> and IN<2> will be described later.

The comparison signal generation circuit 40 may compare the third to eighth input signals IN<3:8> with each other to generate a comparison signal COMP in response to the first and second internal signals IS<1:2>. The comparison signal COMP may be set to be a signal which is enabled to have a logic "high" level if the number of the input signals having the first logic level (e.g., a logic "high" level) among the first to eighth input signals IN<1:8> is an odd number. The first to eighth input signals IN<1:8> may be used as data of a semiconductor device.

Figure 2:
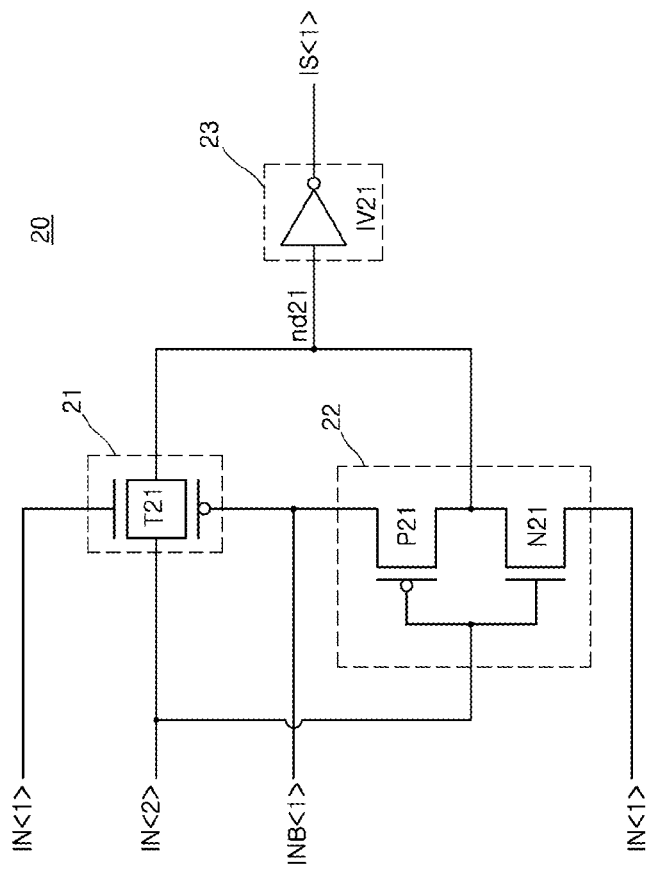
FIG. 2 is a circuit diagram illustrating a representation of an example of a first logic circuit included in the comparison circuit of FIG. 1.

Referring to FIG. 2, the first logic circuit 20 may include a first transmission circuit 21, a first drive circuit 22 and a fifth buffer 23.

The first transmission circuit 21 may be realized using a transfer gate T21. The first transmission circuit 21 may output the second input signal IN<2> to the first output node nd21 if the first input signal IN<1> has the first logic level (e.g., a logic "high" level). The first transmission circuit 21 may turn on the transfer gate T21 to output the second input signal IN<2> to the first output node nd21 if the first input signal IN<1> has the first logic level (e.g., a logic "high" level) and the first inverted input signal INB<1> has the second logic level (e.g., a logic "low" level). The first transmission circuit 21 may turn off the transfer gate T21 to prevent the second input signal IN<2> from being transmitted to the first output node nd21 if the first input signal IN<1> has the second logic level (e.g., a logic "low" level) and the first inverted input signal INB<1> has the first logic level (e.g., a logic "high" level).

The first drive circuit 22 may drive the first output node nd21 in response to the second input signal IN<2> if the first input signal IN<1> has the second logic level (e.g., a logic "low" level). The first drive circuit 22 may be realized using a PMOS transistor P21 and an NMOS transistor N21 which are connected in series and may drive the first output node nd21 in response to the second input signal IN<2> if the first input signal IN<1> has the second logic level (e.g., a logic "low" level) and the first inverted input signal INB<1> has the first logic level (e.g., a logic "high" level). The first drive circuit 22 may terminate driving the first output node nd21 if the first input signal IN<1> has the first logic level (e.g., a logic "high" level) and the first inverted input signal INB<1> has the second logic level (e.g., a logic "low" level).

The fifth buffer 23 may be realized using an inverter IV21 and may inversely buffer a signal of the first output node nd21 to output the inversely buffered signal as the first internal signal IS<1>.

Figure 3:
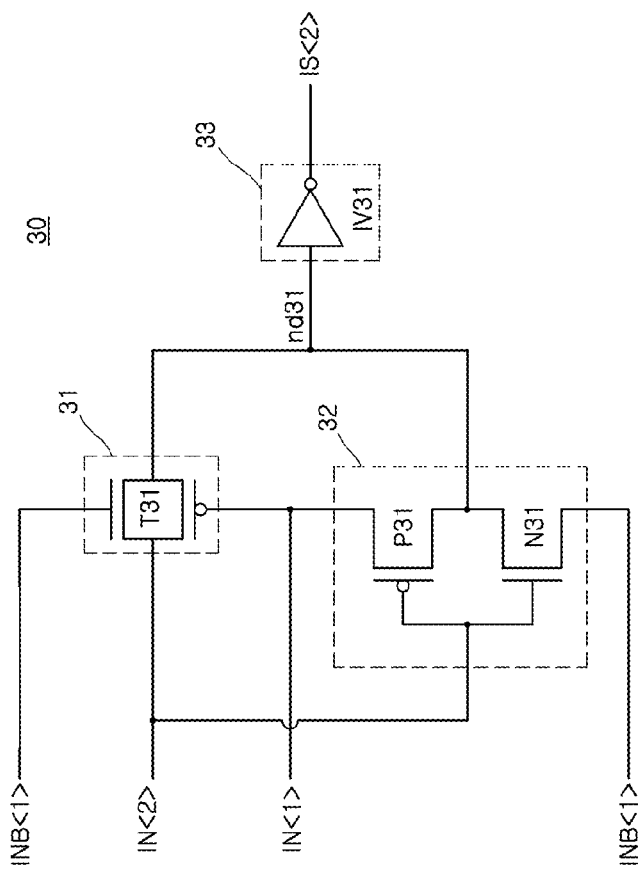
FIG. 3 is a circuit diagram illustrating a representation of an example of a second logic circuit included in the comparison circuit of FIG. 1.

Referring to FIG. 3, the second logic circuit 30 may include a second transmission circuit 31, a second drive circuit 32 and a sixth buffer 33.

The second transmission circuit 31 may be realized using a transfer gate T31. The second transmission circuit 31 may output the second input signal IN<2> to the second output node nd31 if the first input signal IN<1> has the second logic level (e.g., a logic "low" level). The second transmission circuit 31 may turn on the transfer gate T31 to output the second input signal IN<2> to the second output node nd31 if the first input signal IN<1> has the second logic level (e.g., a logic "low" level) and the first inverted input signal INB<1> has the first logic level (e.g., a logic "high" level). The second transmission circuit 31 may turn off the transfer gate T31 to prevent the second input signal IN<2> from being transmitted to the second output node nd31 if the first input signal IN<1> has the first logic level (e.g., a logic "high" level) and the first inverted input signal INB<1> has the second logic level (e.g., a logic "low" level).

The second drive circuit 32 may drive the second output node nd31 in response to the second input signal IN<2> if the first input signal IN<1> has the first logic level (e.g., a logic "high" level). The second drive circuit 32 may be realized using a PMOS transistor P31 and an NMOS transistor N31 which are connected in series and may drive the second output node nd31 in response to the second input signal IN<2> if the first input signal IN<1> has the first logic level (e.g., a logic "high" level) and the first inverted input signal INB<1> has the second logic level (e.g., a logic "low" level). The second drive circuit 32 may terminate driving the second output node nd31 if the first input signal IN<1> has the second logic level (e.g., a logic "low" level) and the first inverted input signal INB<1> has the first logic level (e.g., a logic "high" level).

The sixth buffer 33 may be realized using an inverter IV31 and may inversely buffer a signal of the second output node nd31 to output the inversely buffered signal as the second internal signal IS<2>.

Figure 4:
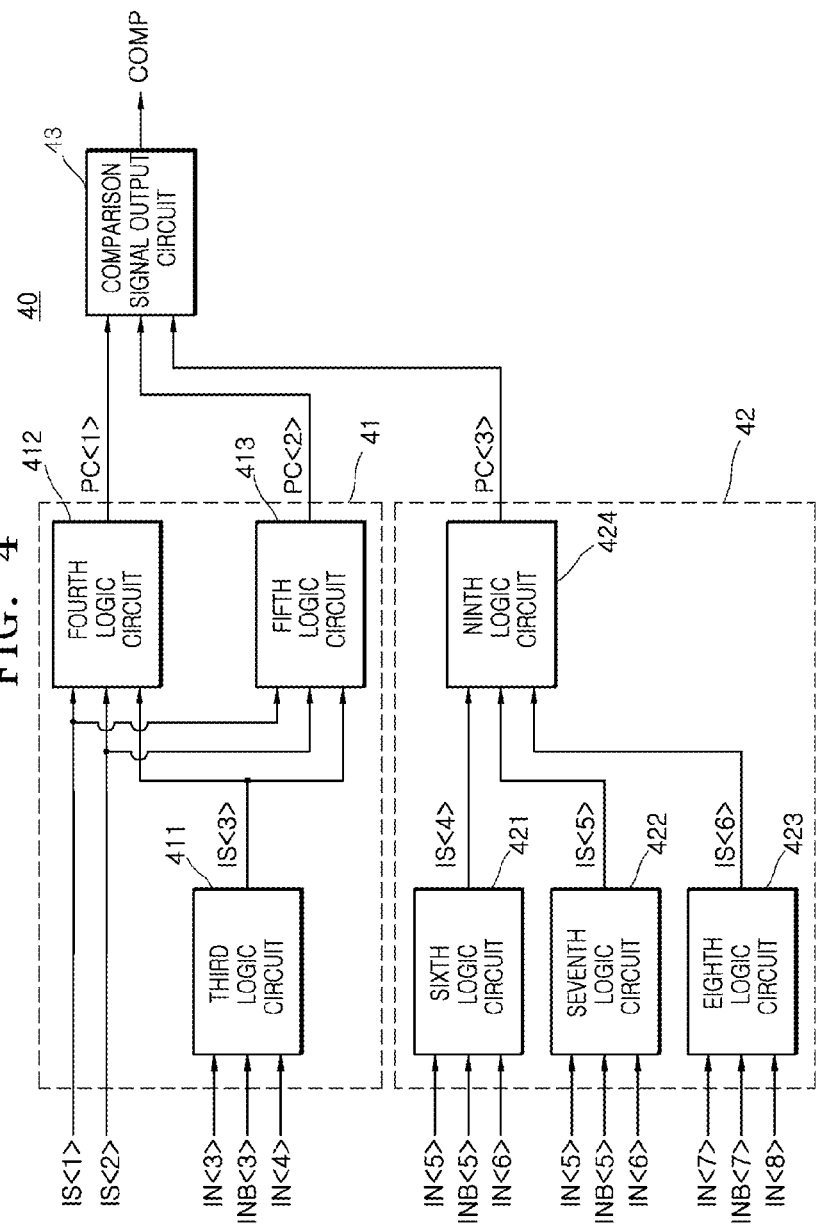
FIG. 4 is a block diagram illustrating a representation of an example of a configuration of a comparison signal generation circuit included in the comparison circuit of FIG. 1.

Referring to FIG. 4, the comparison signal generation circuit 40 may include a first internal comparison circuit 41, a second internal comparison circuit 42 and a comparison signal output circuit 43.

The first internal comparison circuit 41 may include a third logic circuit 411, a fourth logic circuit 412 and a fifth logic circuit 413.

The third logic circuit 411 may execute an exclusive OR operation of the third input signal IN<3> and the fourth input signal IN<4> to generate a third internal signal IS<3>. The third logic circuit 411 may output the fourth input signal IN<4> to a third output node (not illustrated) if the third input signal IN<3> has the first logic level (e.g., a logic "high" level) and may drive the third output node (not illustrated) to generate the third internal signal IS<3> in response to the fourth input signal IN<4> if the third input signal IN<3> has the second logic level (e.g., a logic "low" level). The third logic circuit 411 may be realized to have substantially the same configuration as the first logic circuit 20 illustrated in FIG. 2 except input signals. Thus, the third logic circuit 411 may execute substantially the same operation as the first logic circuit 20. Accordingly, a description of the third logic circuit 411 will be omitted hereinafter.

The fourth logic circuit 412 may execute an exclusive OR operation of the first internal signal IS<1> and the third internal signal IS<3> to generate a first pre-comparison signal PC<1>. The fourth logic circuit 412 may output the third internal signal IS<3> to a fourth output node (not illustrated) if the first internal signal IS<1> has the first logic level (e.g., a logic "high" level) and the second internal signal IS<2> has the second logic level (e.g., a logic "low" level) and may drive the fourth output node (not illustrated) to generate the first pre-comparison signal PC<1> in response to the third internal signal IS<3> if the first internal signal IS<1> has the second logic level (e.g., a logic "low" level) and the second internal signal IS<2> has the first logic level (e.g., a logic "high" level). The fourth logic circuit 412 may be realized to have substantially the same configuration as the first logic circuit 20 illustrated in FIG. 2 except input signals. Thus, the fourth logic circuit 412 may execute substantially the same operation as the first logic circuit 20. Accordingly, a description of the fourth logic circuit 412 will be omitted hereinafter.

The fifth logic circuit 413 may execute an exclusive NOR operation of the first internal signal IS<1> and the third internal signal IS<3> to generate a second pre-comparison signal PC<2>. The fifth logic circuit 413 may output the third internal signal IS<3> to a fifth output node (not illustrated) if the first internal signal IS<1> has the second logic level (e.g., a logic "low" level) and the second internal signal IS<2> has the first logic level (e.g., a logic "high" level) and may drive the fifth output node (not illustrated) to generate the second pre-comparison signal PC<2> in response to the third internal signal IS<3> if the first internal signal IS<1> has the first logic level (e.g., a logic "high" level) and the second internal signal IS<2> has the second logic level (e.g., a logic "low" level). The fifth logic circuit 413 may be realized to have substantially the same configuration as the second logic circuit 30 illustrated in FIG. 3 except input signals. Thus, the fifth logic circuit 413 may execute substantially the same operation as the second logic circuit 30. Accordingly, a description of the fifth logic circuit 413 will be omitted hereinafter.

That is, the first internal comparison circuit 41 may compare the third input signal IN<3> with the fourth input signal IN<4> to generate the first and second pre-comparison signals PC<1:2> in response to the first and second internal signals IS<1:2>.

The second internal comparison circuit 42 may include a sixth logic circuit 421, a seventh logic circuit 422, an eighth logic circuit 423 and a ninth logic circuit 424.

The sixth logic circuit 421 may execute an exclusive OR operation of the fifth input signal IN<5> and the sixth input signal IN<6> to generate a fourth internal signal IS<4>. The sixth logic circuit 421 may output the sixth input signal IN<6> to a sixth output node (not illustrated) if the fifth input signal IN<5> has the first logic level (e.g., a logic "high" level) and may drive the sixth output node (not illustrated) to generate the fourth internal signal IS<4> in response to the sixth input signal IN<6> if the fifth input signal IN<5> has the second logic level (e.g., a logic "low" level). The sixth logic circuit 421 may be realized to have substantially the same configuration as the first logic circuit 20 illustrated in FIG. 2 except input signals. Thus, the sixth logic circuit 421 may execute substantially the same operation as the first logic circuit 20. Accordingly, a description of the sixth logic circuit 421 will be omitted hereinafter.

The seventh logic circuit 422 may execute an exclusive NOR operation of the fifth input signal IN<5> and the sixth input signal IN<6> to generate a fifth internal signal IS<5>. The seventh logic circuit 422 may output the sixth input signal IN<6> to a seventh output node (not illustrated) if the fifth input signal IN<5> has the second logic level (e.g., a logic "low" level) and may drive the seventh output node (not illustrated) to generate the fifth internal signal IS<5> in response to the sixth input signal IN<6> if the fifth input signal IN<5> has the first logic level (e.g., a logic "high" level). The seventh logic circuit 422 may be realized to have substantially the same configuration as the second logic circuit 30 illustrated in FIG. 3 except input signals. Thus, the seventh logic circuit 422 may execute substantially the same operation as the second logic circuit 30. Accordingly, a description of the seventh logic circuit 422 will be omitted hereinafter.

The eighth logic circuit 423 may execute an exclusive OR operation of the seventh input signal IN<7> and the eighth input signal IN<8> to generate a sixth internal signal IS<6>. The eighth logic circuit 423 may output the eighth input signal IN<8> to an eighth output node (not illustrated) if the seventh input signal IN<7> has the first logic level (e.g., a logic "high" level) and may drive the eighth output node (not illustrated) to generate the sixth internal signal IS<6> in response to the eighth input signal IN<8> if the seventh input signal IN<7> has the second logic level (e.g., a logic "low" level). The eighth logic circuit 423 may be realized to have substantially the same configuration as the first logic circuit 20 illustrated in FIG. 2 except input signals. Thus, the eighth logic circuit 423 may execute substantially the same operation as the first logic circuit 20. Accordingly, a description of the eighth logic circuit 423 will be omitted hereinafter.

The ninth logic circuit 424 may execute an exclusive OR operation of the fourth internal signal IS<4> and the sixth internal signal IS<6> to generate a third pre-comparison signal PC<3>. The ninth logic circuit 424 may output the sixth internal signal IS<6> to a ninth output node (not illustrated) if the fourth internal signal IS<4> has the first logic level (e.g., a logic "high" level) and the fifth internal signal IS<5> has the second logic level (e.g., a logic "low" level) and may drive the ninth output node (not illustrated) to generate the third pre-comparison signal PC<3> in response to the sixth internal signal IS<6> if the fourth internal signal IS<4> has the second logic level (e.g., a logic "low" level) and the fifth internal signal IS<5> has the first logic level (e.g., a logic "high" level). The ninth logic circuit 424 may be realized to have substantially the same configuration as the first logic circuit 20 illustrated in FIG. 2 except input signals. Thus, the ninth logic circuit 424 may execute substantially the same operation as the first logic circuit 20. Accordingly, a description of the ninth logic circuit 424 will be omitted hereinafter.

That is, the second internal comparison circuit 42 may compare the fifth to eighth input signals IN<5:8> with each other to generate the third pre-comparison signal PC<3>.

The comparison signal output circuit 43 may inversely buffer or only buffer the third pre-comparison signal PC<3> to generate and output the comparison signal COMP in response to the first and second pre-comparison signals PC<1:2>. The comparison signal output circuit 43 may execute an exclusive OR operation of the first pre-comparison signal PC<1> and the third pre-comparison signal PC<3> to generate the comparison signal COMP. The comparison signal output circuit 43 may output the third pre-comparison signal PC<3> to a tenth output node (not illustrated) if the first pre-comparison signal PC<1> has the first logic level (e.g., a logic "high" level) and the second pre-comparison signal PC<2> has the second logic level (e.g., a logic "low" level) and may drive the tenth output node (not illustrated) to generate the comparison signal COMP in response to the third pre-comparison signal PC<3> if the first pre-comparison signal PC<1> has the second logic level (e.g., a logic "low" level) and the second pre-comparison signal PC<2> has the first logic level (e.g., a logic "high" level). The comparison signal output circuit 43 may be realized to have substantially the same configuration as the first logic circuit 20 illustrated in FIG. 2 except input signals. Thus, the comparison signal output circuit 43 may execute substantially the same operation as the first logic circuit 20. Accordingly, a description of the comparison signal output circuit 43 will be omitted hereinafter Logic levels of the comparison signal COMP generated in the comparison circuit according to an embodiment will be described hereinafter with reference to FIG. 5 in conjunction with a case in which the number of the input signals having the first logic level (i.e., a logic "high" level) among the first to eighth input signals IN<1:8> is an odd number and another case in which the number of the input signals having the first logic level (i.e., a logic "high" level) among the first to eighth input signals IN<1:8> is an even number.

First, a first case is correspond to a case in which the number of the input signals having the first logic level (i.e., a logic "high" level) among the first to eighth input signals IN<1:8> is an even number.

In the first case, the comparison signal COMP may be generated to have a logic "low" level if the first to eighth input signals IN<1:8> have a logic "high(H)" level, a logic "low(L)" level, a logic "high(H)" level, a logic "low(L)" level, a logic "high(H)" level, a logic "low(L)" level, a logic "high(H)" level and a logic "low(L)" level, respectively. The first case may correspond to a case in which the first, third, fifth and seventh input signals IN<1>, IN<3>, IN<5> and IN<7> among the first to eighth input signals IN<1:8> have a logic "high" level. That is, if the number of the input signals having a logic "high" level is an even number, the comparison signal COMP may be generated to have a logic "low" level.

Next, a second case is also correspond to a case in which the number of the input signals having the first logic level (i.e., a logic "high" level) among the first to eighth input signals IN<1:8> is an even number.

In the second case, the comparison signal COMP may be generated to have a logic "low" level if the first to eighth input signals IN<1:8> have a logic "high(H)" level, a logic "high(H)" level, a logic "high(H)" level, a logic "high(H)" level, a logic "low(L)" level, a logic "low(L)" level, a logic "low(L)" level and a logic "low(L)" level, respectively. The second case may correspond to a case in which the first to fourth input signals IN<1:4> among the first to eighth input signals IN<1:8> have a logic "high" level. That is, if the number of the input signals having a logic "high" level is an even number, the comparison signal COMP may be generated to have a logic "low" level.

Next, a third case is correspond to a case in which the number of the input signals having the first logic level (i.e., a logic "high" level) among the first to eighth input signals IN<1:8> is an odd number.

In the third case, the comparison signal COMP may be generated to have a logic "high" level if the first to eighth input signals IN<1:8> have a logic "high(H)" level, a logic "high(H)" level, a logic "high(H)" level, a logic "low(L)" level, a logic "low(L)" level, a logic "low(L)" level, a logic "low(L)" level and a logic "low(L)" level, respectively. The third case may correspond to a case in which the first to third input signals IN<1:3> among the first to eighth input signals IN<1:8> have a logic "high" level. That is, if the number of the input signals having a logic "high" level is an odd number, the comparison signal COMP may be generated to have a logic "high" level.

Next, a fourth case is correspond to a case in which the number of the input signals having the first logic level (i.e., a logic "high" level) among the first to eighth input signals IN<1:8> is an odd number.

In the fourth case, the comparison signal COMP may be generated to have a logic "high" level if the first to eighth input signals IN<1:8> have a logic "high(H)" level, a logic "high(H)" level, a logic "low(L)" level, a logic "low(L)" level, a logic "high(H)" level, a logic "high(H)" level, a logic "low(L)" level and a logic "high(H)" level, respectively. The fourth case may correspond to a case in which the first and second input signals IN<1:2>, the fifth and sixth input signals IN<5:6> and the eighth input signal IN<8> among the first to eighth input signals IN<1:8> have a logic "high" level. That is, if the number of the input signals having a logic "high" level is an odd number, the comparison signal COMP may be generated to have a logic "high" level.

For example, an operation of the comparison circuit according to an embodiment will be described hereinafter in conjunction with the first case and the third case.

First, the operation of the comparison circuit will be described hereinafter in conjunction with the first case.

The inverting circuit 10 may inversely buffer the first, third, fifth and seventh input signals IN<1>, IN<3>, IN<5> and IN<7> to generate the first inverted input signal INB<1> having a logic "low" level, the third inverted input signal INB<3> having a logic "low" level, the fifth inverted input signal INB<5> having a logic "low" level, and the seventh inverted input signal INB<7> having a logic "low" level.

The first logic circuit 20 may output the second input signal IN<2> to the first output node nd21 in response to the first input signal IN<1> having the first logic level (i.e., a logic "high" level) and may inversely buffer a signal of the first output node nd21 to generate the first internal signal IS<1> having a logic "high" level.

The second logic circuit 30 may pull up a level of the second output node nd31 in response to the second input signal IN<2> and may inversely buffer a signal of the second output node nd31 to generate the second internal signal IS<2> having a logic "low" level, because the first input signal IN<1> has the first logic level (i.e., a logic "high" level).

The third logic circuit 411 may output the fourth input signal IN<4> to the third output node (not illustrated) in response to the third input signal IN<3> having the first logic level (i.e., a logic "high" level) and may inversely buffer a signal of the third output node (not illustrated) to generate the third internal signal IS<3> having a logic "high" level.

The fourth logic circuit 412 may output the third internal signal IS<3> to the fourth output node (not illustrated) in response to the first internal signal IS<1> having the first logic level (i.e., a logic "high" level) and the second internal signal IS<2> having the second logic level (i.e., a logic "low" level) and may inversely buffer a signal of the fourth output node (not illustrated) to generate the first pre-comparison signal PC<1> having a logic "low" level.

The fifth logic circuit 413 may pull down a level of the fifth output node (not illustrated) in response to the third internal signal IS<3> and may inversely buffer a signal of the fifth output node (not illustrated) to generate the second pre-comparison signal PC<2> having a logic "high" level, because the first internal signal IS<1> has the first logic level (i.e., a logic "high" level) and the second internal signal IS<2> has the second logic level (i.e., a logic "low" level).

The sixth logic circuit 421 may output the sixth input signal IN<6> to the sixth output node (not illustrated) in response to the fifth input signal IN<5> having the first logic level (i.e., a logic "high" level) and may inversely buffer a signal of the sixth output node (not illustrated) to generate the fourth internal signal IS<4> having a logic "high" level.

The seventh logic circuit 422 may pull up a level of the seventh output node (not illustrated) in response to the sixth input signal IN<6> and may inversely buffer a signal of the seventh output node (not illustrated) to generate the fifth internal signal IS<5> having a logic "low" level, because the fifth input signal IN<5> has the first logic level (i.e., a logic "high" level).

The eighth logic circuit 423 may output the eighth input signal IN<8> to the eighth output node (not illustrated) in response to the seventh input signal IN<7> having the first logic level (i.e., a logic "high" level) and may inversely buffer a signal of the eighth output node (not illustrated) to generate the sixth internal signal IS<6> having a logic "high" level.

The ninth logic circuit 424 may output the sixth internal signal IS<6> to the ninth output node (not illustrated) in response to the fourth internal signal IS<4> having the first logic level (i.e., a logic "high" level) and the fifth internal signal IS<5> having the second logic level (i.e., a logic "low" level) and may inversely buffer a signal of the ninth output node (not illustrated) to generate the third pre-comparison signal PC<3> having a logic "low" level.

The comparison signal output circuit 43 may pull up a level of the tenth output node (not illustrated) in response to the third pre-comparison signal PC<3> and may inversely buffer a signal of the tenth output node (not illustrated) to generate the comparison signal COMP having a logic "low" level, because the first pre-comparison signal PC<1> has the second logic level (i.e., a logic "low" level) and the second pre-comparison signal PC<2> has the first logic level (i.e., a logic "high" level).

That is, the comparison circuit according to an embodiment may generate the comparison signal COMP having a logic "low" level if the number of the input signals having the first logic level (i.e., a logic "high" level) among the first to eighth input signals IN<1:8> is an even number.

Next, the operation of the comparison circuit will be described hereinafter in conjunction with the third case.

The inverting circuit 10 may inversely buffer the first, third, fifth and seventh input signals IN<1>, IN<3>, IN<5> and IN<7> to generate the first inverted input signal INB<1> having a logic "low" level, the third inverted input signal INB<3> having a logic "low" level, the fifth inverted input signal INB<5> having a logic "high" level, and the seventh inverted input signal INB<7> having a logic "high" level.

The first logic circuit 20 may output the second input signal IN<2> to the first output node nd21 in response to the first input signal IN<1> having the first logic level (i.e., a logic "high" level) and may inversely buffer a signal of the first output node nd21 to generate the first internal signal IS<1> having a logic "low" level.

The second logic circuit 30 may pull down a level of the second output node nd31 in response to the second input signal IN<2> and may inversely buffer a signal of the second output node nd31 to generate the second internal signal IS<2> having a logic "high" level, because the first input signal IN<1> has the first logic level (i.e., a logic "high" level).

The third logic circuit 411 may output the fourth input signal IN<4> to the third output node (not shown) in response to the third input signal IN<3> having the first logic level (i.e., a logic "high" level) and may inversely buffer a signal of the third output node (not illustrated) to generate the third internal signal IS<3> having a logic "high" level.

The fourth logic circuit 412 may pull down a level of the fourth output node (not illustrated) in response to the third internal signal IS<3> and may inversely buffer a signal of the fourth output node (not illustrated) to generate the first pre-comparison signal PC<1> having a logic "high" level, because the first internal signal IS<1> has the second logic level (i.e., a logic "low" level) and the second internal signal IS<2> has the first logic level (i.e., a logic "high" level).

The fifth logic circuit 413 may output the third internal signal IS<3> to the fifth output node (not shown) in response to the first internal signal IS<1> having the second logic level (i.e., a logic "low" level) and the second internal signal IS<2> having the first logic level (i.e., a logic "high" level) and may inversely buffer a signal of the fifth output node (not illustrated) to generate the second pre-comparison signal PC<2> having a logic "low" level.

The sixth logic circuit 421 may pull up a level of the sixth output node (not illustrated) in response to the sixth input signal IN<6> and may inversely buffer a signal of the sixth output node (not illustrated) to generate the fourth internal signal IS<4> having a logic "low" level, because the fifth input signal IN<5> has the second logic level (i.e., a logic "low" level).

The seventh logic circuit 422 may output the sixth input signal IN<6> to the seventh output node (not illustrated) in response to the fifth input signal IN<5> having the second logic level (i.e., a logic "low" level) and may inversely buffer a signal of the seventh output node (not illustrated) to generate the fifth internal signal IS<5> having a logic "high" level.

The eighth logic circuit 423 may pull up a level of the eighth output node (not illustrated) in response to the eighth input signal IN<8> and may inversely buffer a signal of the eighth output node (not illustrated) to generate the sixth internal signal IS<6> having a logic "low" level, because the seventh input signal IN<7> has the second logic level (i.e., a logic "low" level).

The ninth logic circuit 424 may pull up a level of the ninth output node (not illustrated) in response to the sixth internal signal IS<6> and may inversely buffer a signal of the ninth output node (not illustrated) to generate the third pre-comparison signal PC<3> having a logic "low" level, because the fourth internal signal IS<4> has the second logic level (i.e., a logic "low" level) and the fifth internal signal IS<5> has the first logic level (i.e., a logic "high" level).

The comparison signal output circuit 43 may output the third pre-comparison signal PC<3> to the tenth output node (not illustrated) in response to the first pre-comparison signal PC<1> having the first logic level (i.e., a logic "high" level) and the second pre-comparison signal PC<2> having the second logic level (i.e., a logic "low" level) and may inversely buffer a signal of the tenth output node (not illustrated) to generate the comparison signal COMP having a logic "high" level.

That is, the comparison circuit according to an embodiment may generate the comparison signal COMP having a logic "high" level if the number of the input signals having the first logic level (i.e., a logic "high" level) among the first to eighth input signals IN<1:8> is an odd number.

According to a comparison circuit having an aforementioned configuration, three-input type exclusive OR gates and three-input type exclusive NOR gates are disposed to have a tree structure and logic levels of a plurality of signals are compared with each other using the three-input type exclusive OR gates and the three-input type exclusive NOR gates which are disposed to have a tree structure. In addition, the number of transistors used in the comparison circuit may be reduced by disposing the three-input type exclusive OR gates and the three-input type exclusive NOR gates in a tree structure to compare logic levels of the plurality of signals with each other.

Figure 6:
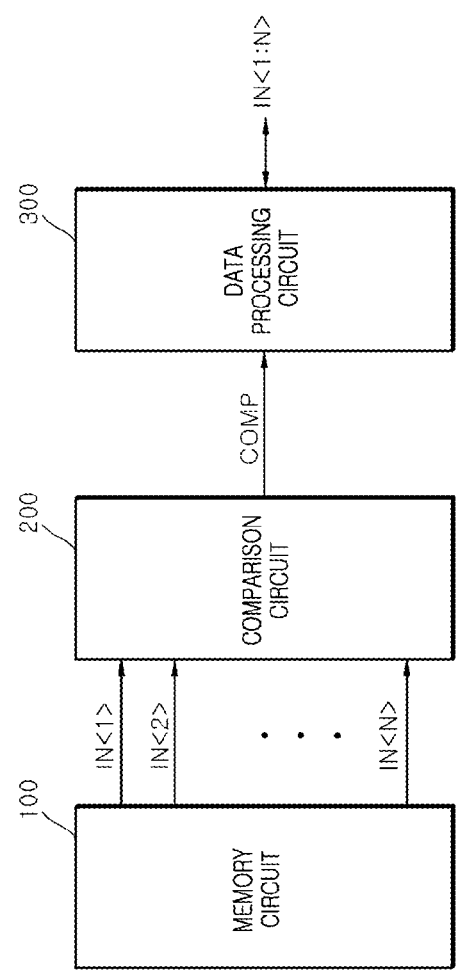
FIG. 6 is a block diagram illustrating a representation of an example of a configuration of a semiconductor device according to an embodiment of the present disclosure.

Referring to FIG. 6, a semiconductor device according to an embodiment may include a memory circuit 100, a comparison circuit 200 and a data processing circuit 300.

The memory circuit 100 may store first to $N^{th}$ input signals IN<1:N> during a write operation and may output the first to $N^{th}$ input signals IN<1:N> during a read operation. The memory circuit 100 may be realized using a general volatile memory device or a nonvolatile memory device. The memory circuit 100 may be realized using one of various circuits that receive and output the first to $N^{th}$ input signals IN<1:N>.

The comparison circuit 200 may compare the first to $N^{th}$ input signals IN<1:N> with each other and may generate a comparison signal COMP which is enabled if the number of the input signals having a first logic level (e.g., a logic "high" level) among the first to $N^{th}$ input signals IN<1:N> is an odd number. The comparison circuit 200 may be realized to have the same configuration as the comparison circuit illustrated in FIG. 1 and to execute substantially the same operation as the comparison circuit illustrated in FIG. 1. Thus, a description of the comparison circuit 200 will be omitted hereinafter to avoid duplicate explanation.

The data processing circuit 300 may correct errors of the first to $N^{th}$ input signals IN<1:N> to output the corrected input signals in response to the comparison signal COMP. The data processing circuit 300 may be realized to include an error correction code (ECC) circuit or a compressive parallel test circuit that corrects logic levels of erroneous input signals among the first to $N^{th}$ input signals IN<1:N> in response to the comparison signal COMP.

The semiconductor device having an aforementioned configuration may include a comparison circuit that is realized using three-input exclusive OR gates and three-input exclusive NOR gates, which are disposed to have a tree structure, to compare logic levels of a plurality of signals with each other.

Figure 7:
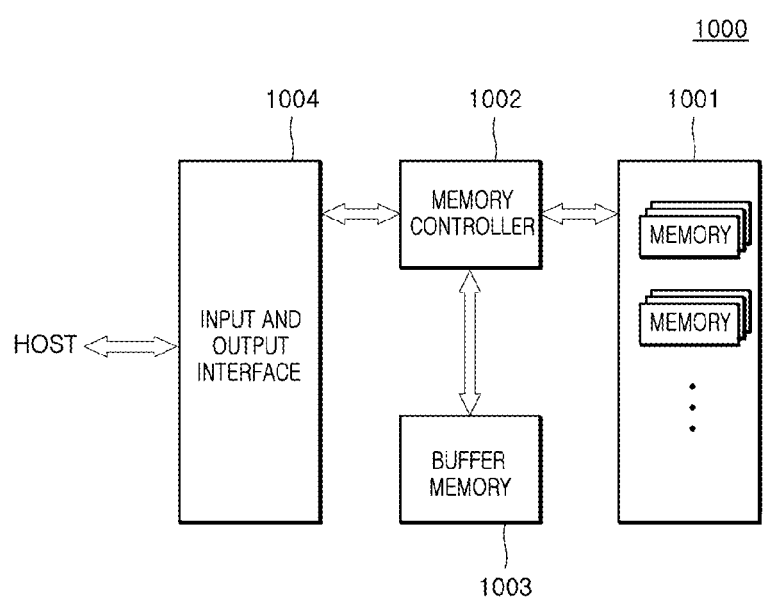
FIG. 7 is a block diagram illustrating a representation of an example of a configuration of an electronic system employing the semiconductor device illustrated in FIGS. 1 to 6.

The comparison circuit or the semiconductor device described with reference to FIGS. 1 to 6 may be applied to an electronic system that includes a memory system, a graphic system, a computing system, a mobile system, or the like. For example, as illustrated in FIG. 7, an electronic system 1000 according an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor device illustrated in FIG. 6. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 7 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A comparison circuit comprising:
a first logic circuit configured to output a second input signal to a first output node if a first input signal has a first logic level and configured to drive the first output node to generate a first internal signal in response to the second input signal if the first input signal has a second logic level;
a second logic circuit configured to output the second input signal to a second output node if the first input signal has the second logic level and configured to drive the second output node to generate a second internal signal in response to the second input signal if the first input signal has the first logic level; and
a comparison signal generation circuit configured to compare third to eighth input signals with each other to generate a comparison signal in response to the first and second internal signals,
wherein the comparison signal is enabled if the number of the input signals having the first logic level among the first to eighth input signals is an odd number, and
wherein the first logic circuit executes an exclusive OR operation of the first and second input signals to generate the first internal signal.

2. The comparison circuit of claim 1, wherein the first logic circuit includes:
a first transmission circuit configured to output the second input signal to the first output node if the first input signal has the first logic level;
a first drive circuit configured to drive the first output node in response to the second input signal if the first input signal has the second logic level; and
a first buffer configured to inversely buffer a signal of the first output node to output the inversely buffered signal as the first internal signal.

3. The comparison circuit of claim 1, wherein the second logic circuit includes:
a second transmission circuit configured to output the second input signal to the second output node if the first input signal has the second logic level;
a second drive circuit configured to drive the second output node in response to the second input signal if the first input signal has the first logic level; and
a second buffer configured to inversely buffer a signal of the second output node to output the inversely buffered signal as the second internal signal.

4. The comparison circuit of claim 1, wherein the comparison signal generation circuit includes:
a first internal comparison circuit configured to compare the third and fourth input signals to generate a first pre-comparison signal and a second pre-comparison signal in response to the first and second internal signals;
a second internal comparison circuit configured to compare the fifth to eighth input signals to generate a third pre-comparison signal; and
a comparison signal output circuit configured to inversely buffer or only buffer the third pre-comparison signal to output the inversely buffered signal or the only buffered signal as the comparison signal in response to the first and second pre-comparison signals.

5. The comparison circuit of claim 4, wherein the first internal comparison circuit includes:
a third logic circuit configured to output the fourth input signal to a third output node if the third input signal has the first logic level and configured to drive the third output node to generate a third internal signal in response to the fourth input signal if the third input signal has the second logic level;
a fourth logic circuit configured to inversely buffer or only buffer the third internal signal to output the inversely buffered signal or the only buffered signal as the first pre-comparison signal in response to the first and second internal signals; and
a fifth logic circuit configured to inversely buffer or only buffer the third internal signal to output the inversely buffered signal or the only buffered signal as the second pre-comparison signal in response to the first and second internal signals.

6. The comparison circuit of claim 4, wherein the second internal comparison circuit includes:
a sixth logic circuit configured to output the sixth input signal to a fourth output node if the fifth input signal has the first logic level and configured to drive the fourth output node to generate a fourth internal signal in response to the sixth input signal if the fifth input signal has the second logic level;
a seventh logic circuit configured to output the sixth input signal to a fifth output node if the fifth input signal has the second logic level and configured to drive the fifth output node to generate a fifth internal signal in response to the sixth input signal if the fifth input signal has the first logic level;
an eighth logic circuit configured to output the eighth input signal to a sixth output node if the seventh input signal has the first logic level and configured to drive the sixth output node to generate a sixth internal signal in response to the eighth input signal if the seventh input signal has the second logic level; and
a ninth logic circuit configured to inversely buffer or only buffer the sixth internal signal to output the inversely buffered signal or the only buffered signal as the third pre-comparison signal in response to the fourth and fifth internal signals.

7. A semiconductor device comprising:
a memory circuit configured to store first to eighth input signals during a write operation and configured to output the first to eighth input signals during a read operation;

a comparison circuit configured to compare logic levels of the first to eighth input signals with each other and configured to generate a comparison signal which is enabled if the number of the input signals having the first logic level among the first to eighth input signals is an odd number; and a data processing circuit configured to correct errors of the first to eighth input signals to output the corrected input signals in response to the comparison signal.

8. The semiconductor device of claim 7, wherein the comparison circuit includes:

a first logic circuit configured to output the second input signal to a first output node if the first input signal has the first logic level and configured to drive the first output node to generate a first internal signal in response to the second input signal if the first input signal has a second logic level;

a second logic circuit configured to output the second input signal to a second output node if the first input signal has the second logic level and configured to drive the second output node to generate a second internal signal in response to the second input signal if the first input signal has the first logic level; and a comparison signal generation circuit configured to compare the third to eighth input signals with each other to generate the comparison signal in response to the first and second internal signals.

9. The semiconductor device of claim 8, wherein the first logic circuit includes:

a first transmission circuit configured to output the second input signal to the first output node if the first input signal has the first logic level;

a first drive circuit configured to drive the first output node in response to the second input signal if the first input signal has the second logic level; and a first buffer configured to inversely buffer a signal of the first output node to output the inversely buffered signal as the first internal signal.

10. The semiconductor device of claim 8, wherein the second logic circuit includes:

a second transmission circuit configured to output the second input signal to the second output node if the first input signal has the second logic level;

a second drive circuit configured to drive the second output node in response to the second input signal if the first input signal has the first logic level; and a second buffer configured to inversely buffer a signal of the second output node to output the inversely buffered signal as the second internal signal.

11. The semiconductor device of claim 8, wherein the comparison signal generation circuit includes:

a first internal comparison circuit configured to compare the third and fourth input signals to generate a first pre-comparison signal and a second pre-comparison signal in response to the first and second internal signals;

a second internal comparison circuit configured to compare the fifth to eighth input signals to generate a third pre-comparison signal; and a comparison signal output circuit configured to inversely buffer or only buffer the third pre-comparison signal to output the inversely buffered signal or the only buffered signal as the comparison signal in response to the first and second pre-comparison signals.

12. The semiconductor device of claim 11, wherein the first internal comparison circuit includes:

a third logic circuit configured to output the fourth input signal to a third output node if the third input signal has the first logic level and configured to drive the third output node to generate a third internal signal in response to the fourth input signal if the third input signal has the second logic level;

a fourth logic circuit configured to inversely buffer or only buffer the third internal signal to output the inversely buffered signal or the only buffered signal as the first pre-comparison signal in response to the first and second internal signals; and a fifth logic circuit configured to inversely buffer or only buffer the third internal signal to output the inversely buffered signal or the only buffered signal as the second pre-comparison signal in response to the first and second internal signals.

13. The semiconductor device of claim 11, wherein the second internal comparison circuit includes:

a sixth logic circuit configured to output the sixth input signal to a fourth output node if the fifth input signal has the first logic level and configured to drive the fourth output node to generate a fourth internal signal in response to the sixth input signal if the fifth input signal has the second logic level;

a seventh logic circuit configured to output the sixth input signal to a fifth output node if the fifth input signal has the second logic level and configured to drive the fifth output node to generate a fifth internal signal in response to the sixth input signal if the fifth input signal has the first logic level;

an eighth logic circuit configured to output the eighth input signal to a sixth output node if the seventh input signal has the first logic level and configured to drive the sixth output node to generate a sixth internal signal in response to the eighth input signal if the seventh input signal has the second logic level; and a ninth logic circuit configured to inversely buffer or only buffer the sixth internal signal to output the inversely buffered signal or the only buffered signal as the third pre-comparison signal in response to the fourth and fifth internal signals.

14. A comparison circuit comprising:

a number of first logic circuits and a number of second logic circuits, the first logic circuits and second logic circuits configured to compare logic levels of a plurality of input signals with each other to generate a comparison signal having a first logic level if the number of input signals have an even number of input signals at a second logic level.

15. The comparison circuit of claim 14, wherein the second logic circuits and first logic circuits are configured to compare the logic levels of the plurality of input signals with each other to generate the comparison signal having the second logic level if the number of input signals have an odd number of input signals at the second logic level.

16. The comparison circuit of claim 14, wherein the number of first logic circuits is at least seven.

17. The comparison circuit of claim 14, wherein the number of second logic circuits is at least three.

18. The comparison circuit of claim 14, wherein the plurality of input signals includes first to eighth input signals.

19. The comparison circuit of claim 14, wherein a first logic circuit, from the number of first logic circuits, is configured to output a second input signal to a first output node if a first input signal has the second logic level and configured to drive the first output node to generate a first internal signal based on the second input signal if the first input signal has the first logic level; and wherein a second logic circuit, from the number of second logic circuits, is configured to output the second input signal to a second output node if the first input signal has the first logic level and configured to drive the second output node to generate a second internal signal based on the second input signal if the first input signal has the second logic level.

20. The comparison circuit of claim 14, wherein the first logic circuits and second logic circuits are arranged in a tree structure.

* * * * *